(12) United States Patent
Matero

(10) Patent No.: US 8,767,876 B2
(45) Date of Patent: Jul. 1, 2014

(54) FILTER OFFSET COMPENSATION

(71) Applicant: ST-Ericsson SA, Plan-les-Ouates (CH)

(72) Inventor: Jorma Pertti Matero, Oulu (FI)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/721,455

(22) Filed: Dec. 20, 2012

(65) Prior Publication Data

US 2013/0170589 A1    Jul. 4, 2013

Related U.S. Application Data

(60) Provisional application No. 61/582,300, filed on Dec. 31, 2011.

(51) Int. Cl.
*H04L 27/12* (2006.01)

(52) U.S. Cl.
USPC ........... 375/305; 375/295; 375/296; 322/127; 322/128; 322/125; 322/123; 322/117; 322/124

(58) Field of Classification Search
USPC .......... 375/305, 295, 296; 322/127, 128, 125, 322/123, 117, 124
See application file for complete search history.

(56) References Cited

U.S. PATENT DOCUMENTS

| | | |
|---|---|---|
| 6,515,553 B1 | 2/2003 | Filiol et al. |
| 7,051,127 B2 | 5/2006 | Molgaard et al. |
| 7,120,396 B2 | 10/2006 | Wilson |
| 7,912,145 B2 | 3/2011 | Yellin et al. |
| 2004/0184555 A1* | 9/2004 | Kayanuma ............... 375/295 |

FOREIGN PATENT DOCUMENTS

EP    0417390 A2    3/1991

OTHER PUBLICATIONS

Staszewski et al., All-Digital PLL and GSM/EDGE Transmitter in 90nm CMOS, Digest of Tech. Papers 2005 Int'l Solid-State Circuits Conf., Feb. 8, 2005, pp. 316-317, 600, IEEE.

* cited by examiner

*Primary Examiner* — Siu Lee

(74) *Attorney, Agent, or Firm* — Piedmont Intellectual Property

(57) ABSTRACT

Problems arising from a pre-emphasis filter, particularly an infinite-impulse-response filter, in a signal modulator are solved by detecting sequences of the same bit or symbol in a modulation signal and compensating the corresponding d.c. offset in the signal generated by the pre-emphasis filter without real-time feedback. The amount of offset compensation can be defined during design of the modulator or adjusted or calibrated during production. It is not necessary to change the transfer function of the pre-emphasis filter, but only to correct the d.c. offset of the filter output signal.

12 Claims, 9 Drawing Sheets

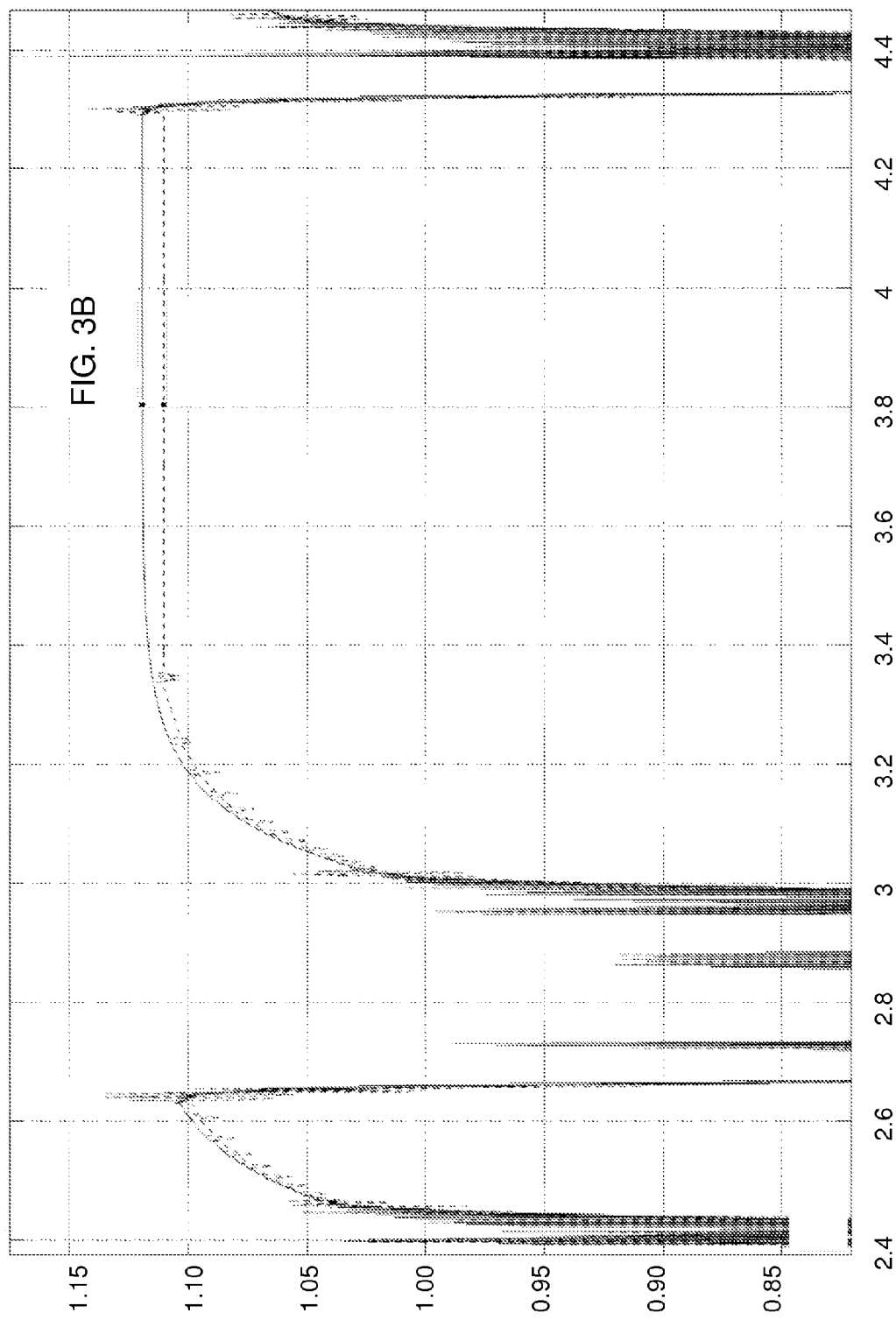

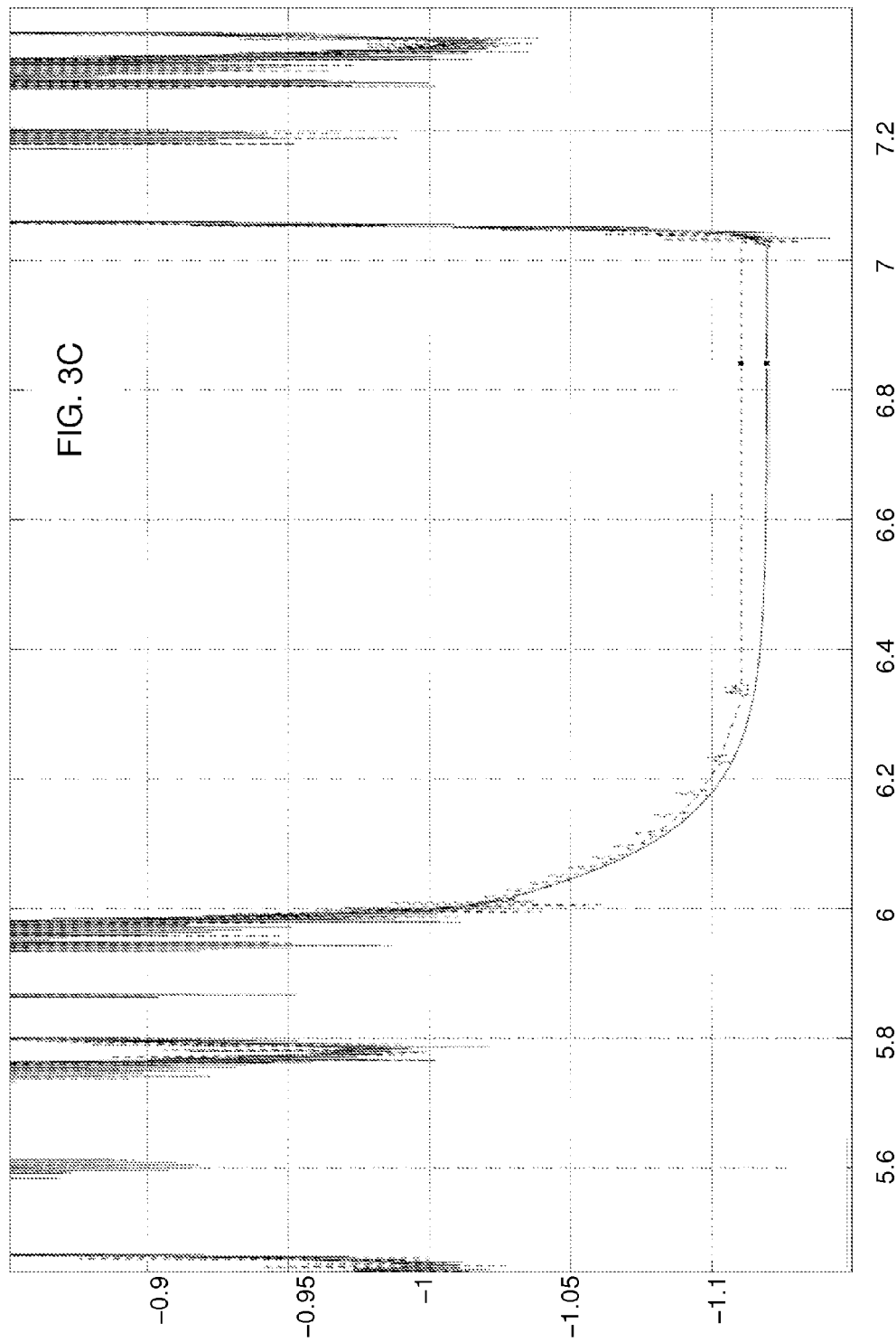

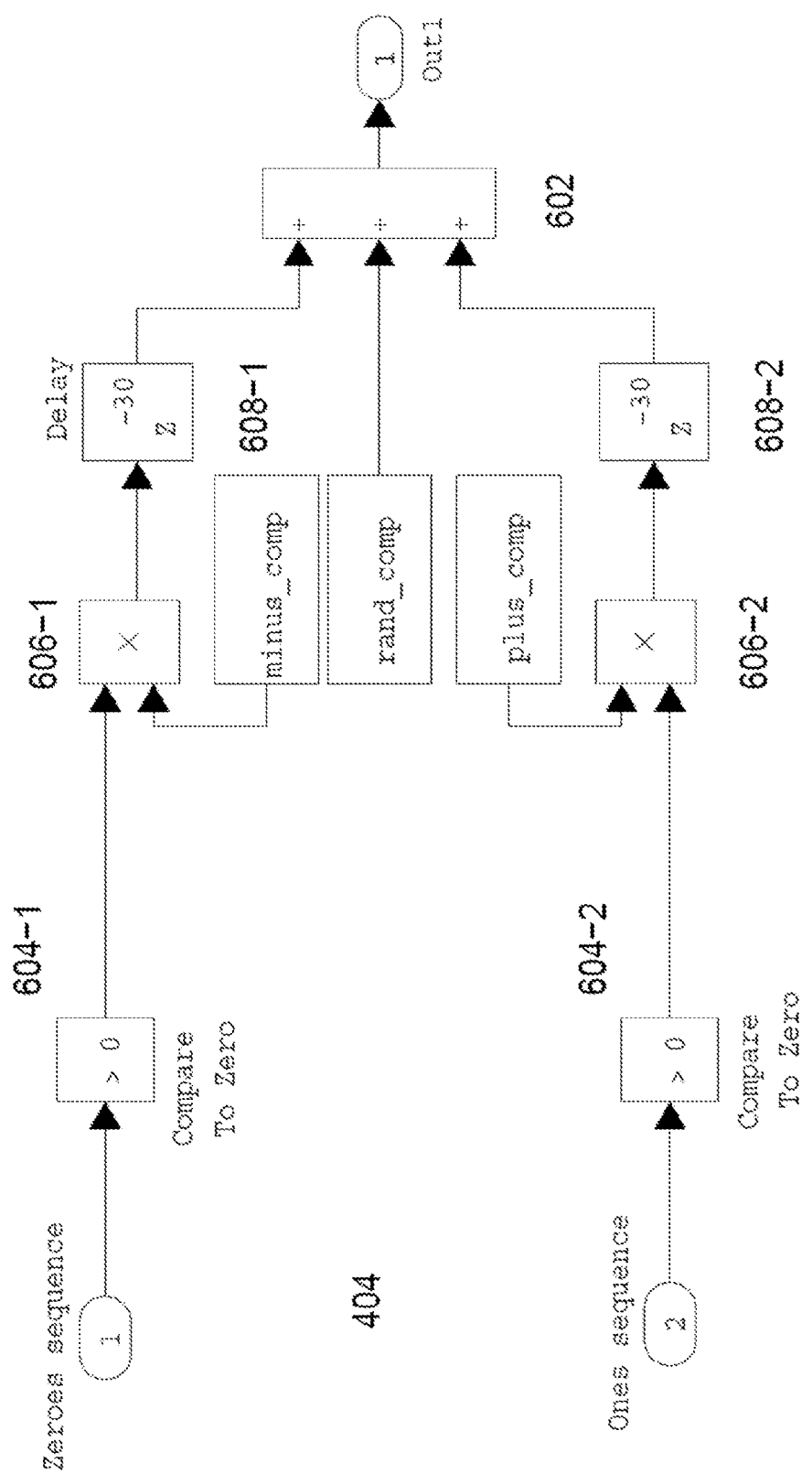

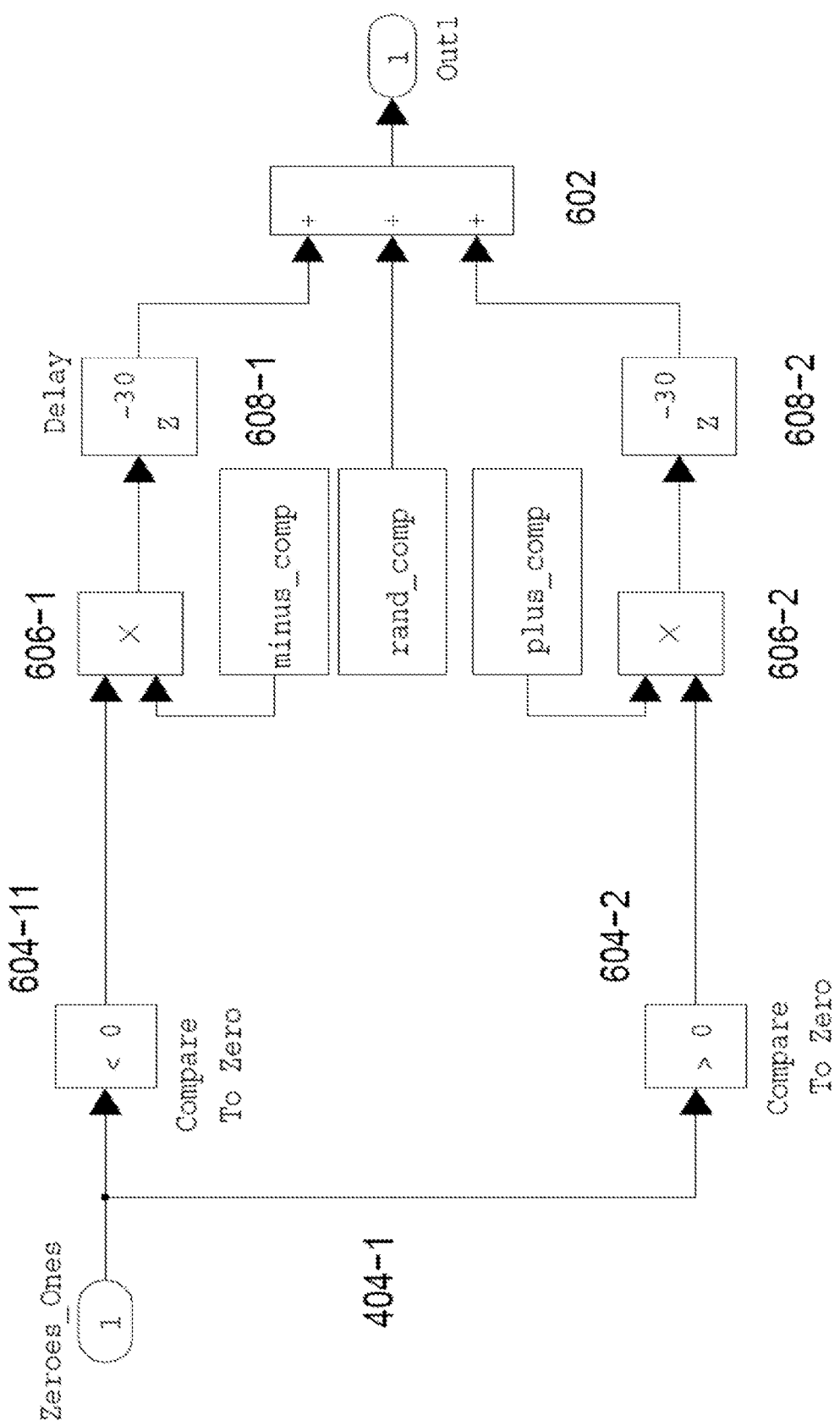

FILTER OFFSET COMPENSATION

This application claims the benefit of the filing date of U.S. Provisional Patent Application No. 61/582,300 filed on Dec. 31, 2011, which is incorporated here by reference.

BACKGROUND

This invention relates to digital filters and more particularly to digital filters used in communication systems.

In many wireless communication systems, such as those compliant with technical specifications organized by the Third Generation Partnership Project (3GPP), gaussian minimum shift keying (GMSK) modulation is used for impressing digital data onto a radio frequency (RF) carrier signal. The modulated carrier signal is then transmitted by a communication device, such as a mobile telephone, computer, network base station, etc.

A frequency synthesizer that generates the RF carrier signal in the transmitter (TX) of the communication device can be configured for direct GMSK modulation. Direct synthesizer modulation can give better RF signal-to-noise performance than a traditional quadrature (in-phase/quadrature-phase, or I/O) RF modulator. The frequency synthesizer in many communication devices is a phase-locked loop (PLL).

FIG. 1 is a block diagram of a portion 100 of a transmitter of a communication device that implements single-point modulation. Data bits to be modulated onto the carrier signal are passed through a Gaussian pulse-shaping filter 102 and a pre-emphasis filter 104 to a summer 106 that also receives a suitable frequency control signal from a controller 108. The output of the summer 106 is a control signal for a PLL 110 that includes a reference frequency generator 112, a phase detector 114, a loop filter 116, a voltage-controlled oscillator (VCO) 118, and a fractional-N divider 120. The PLL 110 generates a GMSK-modulated RF carrier signal that can be amplified by a power amplifier and transmitted through a suitable antenna. The power amplifier and antenna are not shown in FIG. 1 for clarity.

The Gaussian pulse-shaping filter 102 can conveniently be a digital filter, and the pre-emphasis can be implemented either by modifying the taps (i.e., filter coefficients) of the Gaussian filter 102 or by using a separate pre-emphasis filter 104 as depicted in FIG. 1. The Gaussian filter 102 typically has a Finite Impulse Response (FIR) topology, and the pre-emphasis filter 104 can have an FIR or Infinite Impulse Response (IIR) topology.

As seen in FIG. 1, the modulation is applied at a single point, i.e., the control input of the fractional-N synthesizer frequency divider 120, which receives the output of the summer 106 as a control word. The divided VCO frequency is compared to the reference frequency, and since the modulation affects the division ratio, the modulation is applied to the VCO, which provides the modulated signal generated by the PLL 110.

A problem arises in that a PLL can have a frequency response, or modulation bandwidth (BW), that is too low for the GMSK modulation specified for the particular communication system. The PLL 110 has a low-pass frequency response for the divider 120/summer 106 modulation point, but a role of the pre-emphasis filter 104 is to overcome the PLL BW limitation. The pre-emphasis filter 104 has a high-pass frequency response that is matched to compensate the PLL's low-pass frequency response. The cascade of the pre-emphasis filter 104 and PLL 110 can have a frequency response that is wide enough for the desired GMSK signal.

U.S. Pat. No. 7,912,145 shows a basic structure of a fractional-N synthesizer, with an adaptive pre-emphasis filter that is controlled by an incoming signal W and comparing with the feedback from a VCO control voltage. The pre-emphasis filter's transfer function, i.e., its frequency response, i.e., is changed based on the input signal and feedback signal difference.

Another way to handle the sometimes limited bandwidth of a PLL-based direct-modulated transmitter is to use two-point modulation. FIG. 2 is a block diagram of a portion 200 of a transmitter of a communication device that implements two-point modulation. It will be understood that there is typically no need for pre-emphasis in two-point modulation. Thus, FIG. 2 shows many of the same components as FIG. 1 that are identified by the same reference numerals, but the arrangement in FIG. 2 omits the pre-emphasis filter 104 and changes the PLL 210. Instead of a single-point modulation at the summer 106, FIG. 2 shows the modulation is applied at two points: the control input of the fractional-N divider 120 generated by the summer 106 as in FIG. 1, and the input of the VCO 118 that is generated by a second summer 222. From the point of view of the modulated output signal, the PLL 210 has a low-pass frequency response for the divider 120/summer 106 modulation point and a high-pass frequency response for the VCO 118/summer 222 modulation point. The two modulation points make it possible to widen the modulation BW with suitably scaled signal levels at the modulation points.

A FIR filter can require a large number of taps in order to get the desired transfer function, or frequency response, which means a large size in an implementation on an integrated circuit, but a FIR filter has no signal level offset problem. An IIR filter is compact in size, but it has an offset problem when it is implemented using fixed-point arithmetic. Signal level offsets are generated when there are long sequences of successive zeros or ones in the stream of modulation data bits, or symbols, i.e., when an IIR filter has an input signal value that is constant for a long-enough period of time. The filter offset is seen as a frequency deviation error of the modulated RF signal, and ultimately as increased root-mean-square (RMS) phase error.

U.S. Pat. No. 7,051,127 selectively pre-emphasizes data, and adds a parallel driver, which is used during the initial portion of a sequence of same symbols/data to compensate circuit level errors in interfaces between integrated circuits (ICs).

SUMMARY

Problems with prior implementations of a PLL-based signal modulator having a pre-emphasis filter are avoided by embodiments of this invention. Problem-causing sequences of input data are detected and compensated at the output of the pre-emphasis filter.

In accordance with aspects of this invention, there is provided an electronic signal modulator that includes a pulse-shaping filter that receives a digital modulation data signal; a high-pass pre-emphasis filter; a phase-locked loop (PLL) that generates a carrier signal modulated by the modulation data signal, wherein the PLL has a low-pass frequency response to be compensated by a frequency response of the pre-emphasis filter; a sequence detector configured to detect a sequence of bits of the modulation data signal that are the same, wherein the sequence has a length of at least a number N of bits, and the sequence detector generates an output signal based on a sequence detected; an offset compensator responsive to the output signal of the sequence detector and configured to add a compensation value to an output of the pre-emphasis filter;

and a summer configured for receiving an output of the pre-emphasis filter and the compensation value and for generating a control signal applied to the PLL.

Also in accordance with aspects of this invention, there is provided a method of compensating a frequency response of an electronic signal modulator. The method includes high-pass filtering a digital modulation data signal, thereby generating a filtered modulation signal; detecting a sequence of bits of the digital modulation data signal that are the same, wherein the sequence has a length of at least a number N of bits; selecting a compensation value based on a sequence detected; combining the compensation value and the filtered modulation signal, thereby generating a compensated modulation signal; and generating a carrier signal modulated by the compensated modulation data signal.

BRIEF DESCRIPTION OF THE DRAWINGS

This invention will be understood by reading this description in conjunction with the accompanying drawings, in which:

FIGS. 3A, 3B, 3C illustrate simulated results of sequences of binary ones and zeroes as modulation data bits input to the arrangement of FIG. 1;

FIGS. 6A, 6B are block diagrams of example embodiments of an offset compensator for the arrangement of FIG. 4;

DETAILED DESCRIPTION

The inventor has recognized that problems arising from a pre-emphasis filter, particularly an IIR pre-emphasis filter, in a signal modulator can be solved by looking for sequences of the same bit or symbol in a modulation signal and compensating the corresponding d.c. offset in the signal generated by the pre-emphasis filter in a kind of feed-forward manner without real-time feedback. It will be understood that feed-forward techniques are used in many devices, such as pre-distortion-compensated power amplifiers, etc. The amount of offset compensation can be defined during design of the modulator or adjusted or calibrated during production. It is not necessary to change the transfer function of the pre-emphasis filter, but only to correct the d.c. offset of the filter output signal. It should also be understood that it is not necessary for the pre-emphasis filter to be an IIR filter.

Figure 1:
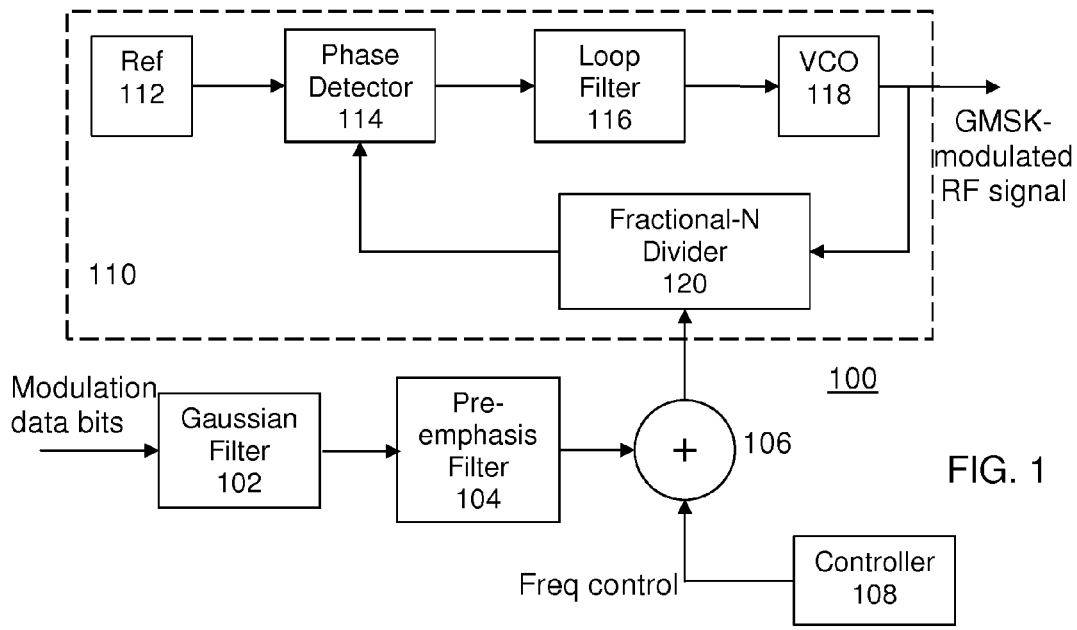
FIG. 1 is a block diagram of a portion of a transmitter of a communication device that implements single-point modulation.
Figure 2:
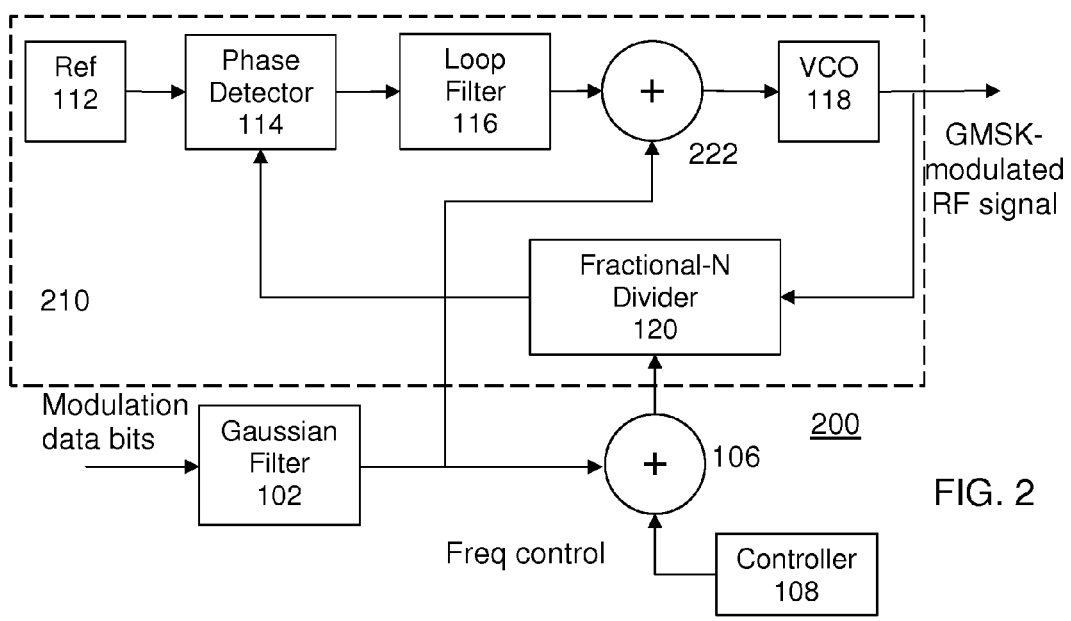
FIG. 2 is a block diagram of a portion of a transmitter of a communication device that implements two-point modulation.
Figure 3A:
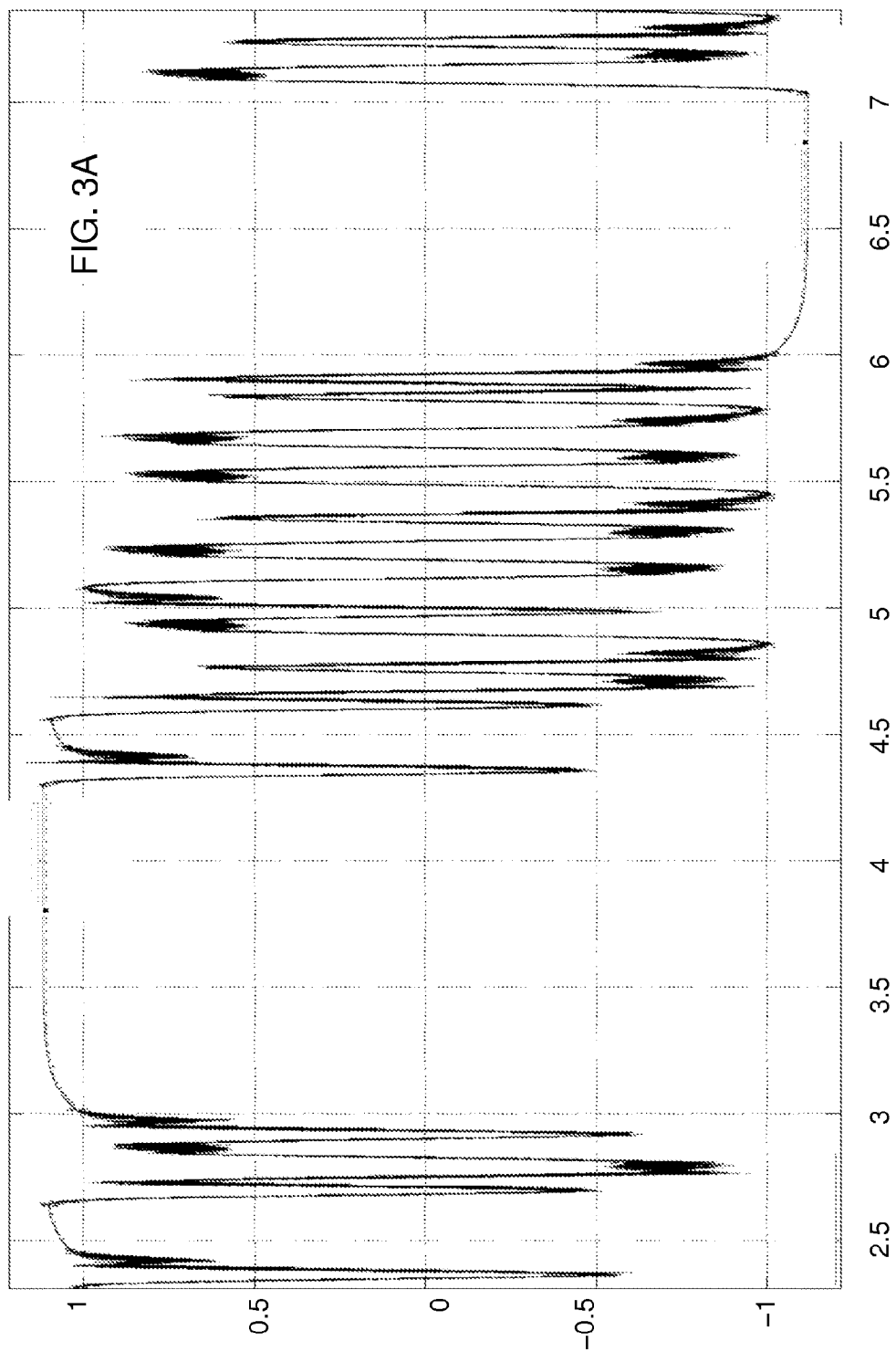

Computer simulations of transmitters such as those illustrated by FIGS. 1 and 2 show that a signal level offset, after it has settled, stays constant as long as the filter input has a fixed value. FIG. 3A shows simulated test cases of long sequences of binary ones and zeroes as modulation data bits input to the Gaussian filter 102 in FIG. 1 with an IIR pre-emphasis filter 104 implemented by floating-point arithmetic (indicated by the continuous line) and by fixed-point arithmetic (indicated by the dashed line). FIG. 3B is a magnified view of FIG. 3A in a portion of a long sequence binary ones, and FIG. 3C is a magnified view of FIG. 3A in a portion of a long sequence binary zeroes. In all three figures, a sequence or time index is shown on the long axis, and an amplitude is shown on the short axis. In FIGS. 3A, 3B, 3C, time is in seconds in units of 0.1 milliseconds, and amplitude is in plain numbers.

As can be seen from FIGS. 3A, 3B, 3C, the floating-point (ideal) and fixed-point implementations of the digital pre-emphasis filter 104 match well for input data that does not have too many consecutive bits or symbols that have the same value. Such data is generally called random data in this application. For long enough input sequences of ones, however, the fixed-point filter output saturates at a value of about $1.110 \times 10^5$. That saturation value is too low, as seen from the value of $1.119 \times 10^5$ reached by the floating-point filter. See FIG. 3B. For long enough input sequences of zeroes, the fixed-point filter output saturates at a value of about $-1.110 \times 10^5$. That saturation value is too high, as seen from the value of $-1.119 \times 10^5$ reached by the floating-point filter. See FIG. 3C. How many consecutive bits are too many is discussed in more detail below.

Figure 4:
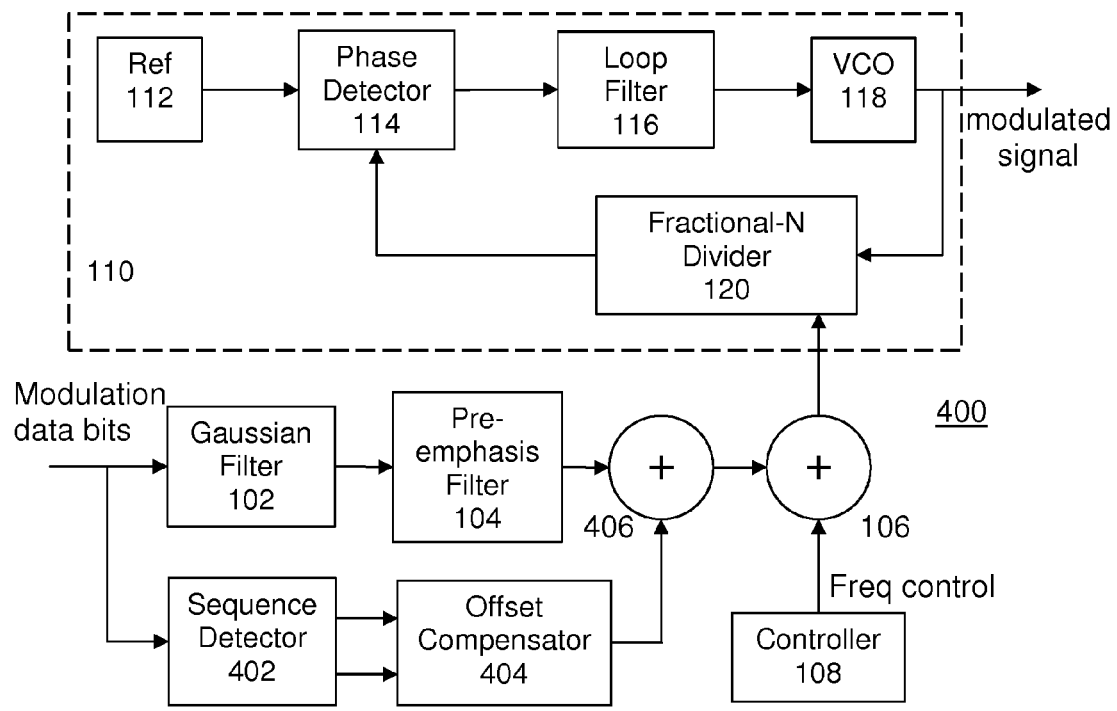
FIG. 4 is a block diagram of an example embodiment of the invention in a portion of a transmitter of a communication device that implements single-point modulation.
Figure 4A:
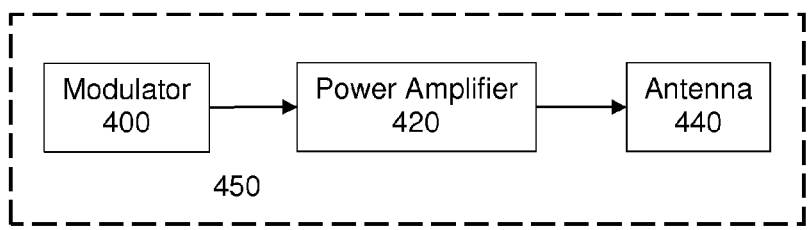
FIG. 4A is a block diagram of a transmitter of a communication device in accordance with the invention.

FIG. 4 is a block diagram of an example embodiment of the invention in a portion 400 of a transmitter of a communication device that implements single-point modulation. As in the arrangement depicted by FIG. 1, data bits to be modulated onto a carrier signal are passed through a Gaussian pulse-shaping filter 102 and a pre-emphasis filter 104. A summer 106 receives a suitable frequency control signal from a controller 108. The output of the summer 106 is a control signal for a PLL 110 that includes a reference frequency generator 112, a phase detector 114, a loop filter 116, a VCO 118, and a fractional-N divider 120. The PLL 110 generates a modulated signal, which can be a GMSK-modulated RF carrier signal, that can be amplified by a power amplifier and transmitted through a suitable antenna. The power amplifier and antenna are not shown in FIG. 4 for clarity, but are depicted in FIG. 4A as described below. It will be appreciated that the VCO output frequency can be the frequency of the carrier signal, but that is not necessary. The VCO output frequency can be a multiple of the carrier frequency, in which case, the VCO output frequency is suitably divided down to the desired carrier frequency before the modulated signal is provided to the rest of the transmitter.

In contrast to the arrangement depicted in FIG. 1, the portion 400 includes a sequence detector 402 that also receives the data bits or symbols to be modulated onto the carrier signal, an offset compensator 404 that receives one or more output signals from the detector 402, and a summer 406 that additively combines a compensation signal generated by the offset compensator 404 and the pulse-shaped and filtered modulation data bits generated by the Gaussian filter 102 and pre-emphasis filter 104. The combined signal produced by the summer 406 is provided to the summer 106, which combines that signal and the frequency control signal from the controller 108.

It will be appreciated that the functionalities of the summers 106, 406 can be combined in a single summer that receives the outputs of the pre-emphasis filter 104, offset compensator 404, and controller 108 and generates the modulation control signal for the PLL 110.

In general, the sequence detector 402 reads modulation data bits at the input of the Gaussian pulse-shaping filter 102 and generates an output signal that indicates consecutive occurrence of a number N or more of the same bit values. For example, the sequence detector 402 can be configured to generate a zeroes-sequence output signal and a ones-sequence output signal such that when N or more successive zero bits occur in the modulation data stream, the zeroes-sequence output is a logical HIGH level and the ones-sequence output is a logical LOW level; when N or more successive one bits occur in the modulation data stream, the ones-sequence output is HIGH and the zeroes-sequence output is LOW; and when fewer than N successive bits in the modulation data stream are one or zero, both the zeroes-sequence output and the ones-sequence output are LOW.

Computer simulations of the arrangement depicted in FIG. 4 indicated that the best performance was found when offset compensation was applied for modulation data sequences having lengths N greater than or equal to five of the same bit values or symbols. Although performance was improved over the arrangement depicted in FIG. 1 when compensation was applied to sequences having lengths greater than or equal to three of the same bit values or symbols, some performance degradation was found for sequences of random modulation data. The sequence detector can be configured accordingly.

FIG. 4A is a block diagram of a transmitter 450 of a communication device in accordance with aspects of this invention. Besides a modulator 400, the transmitter includes a power amplifier 420 configured to receive the carrier signal modulated by the modulation data signal, and an antenna 440 configured to transmit a signal generated by the power amplifier. It will be understood that the communication device typically includes other devices that are not shown in FIG. 4A simply for clarity.

Figure 5:
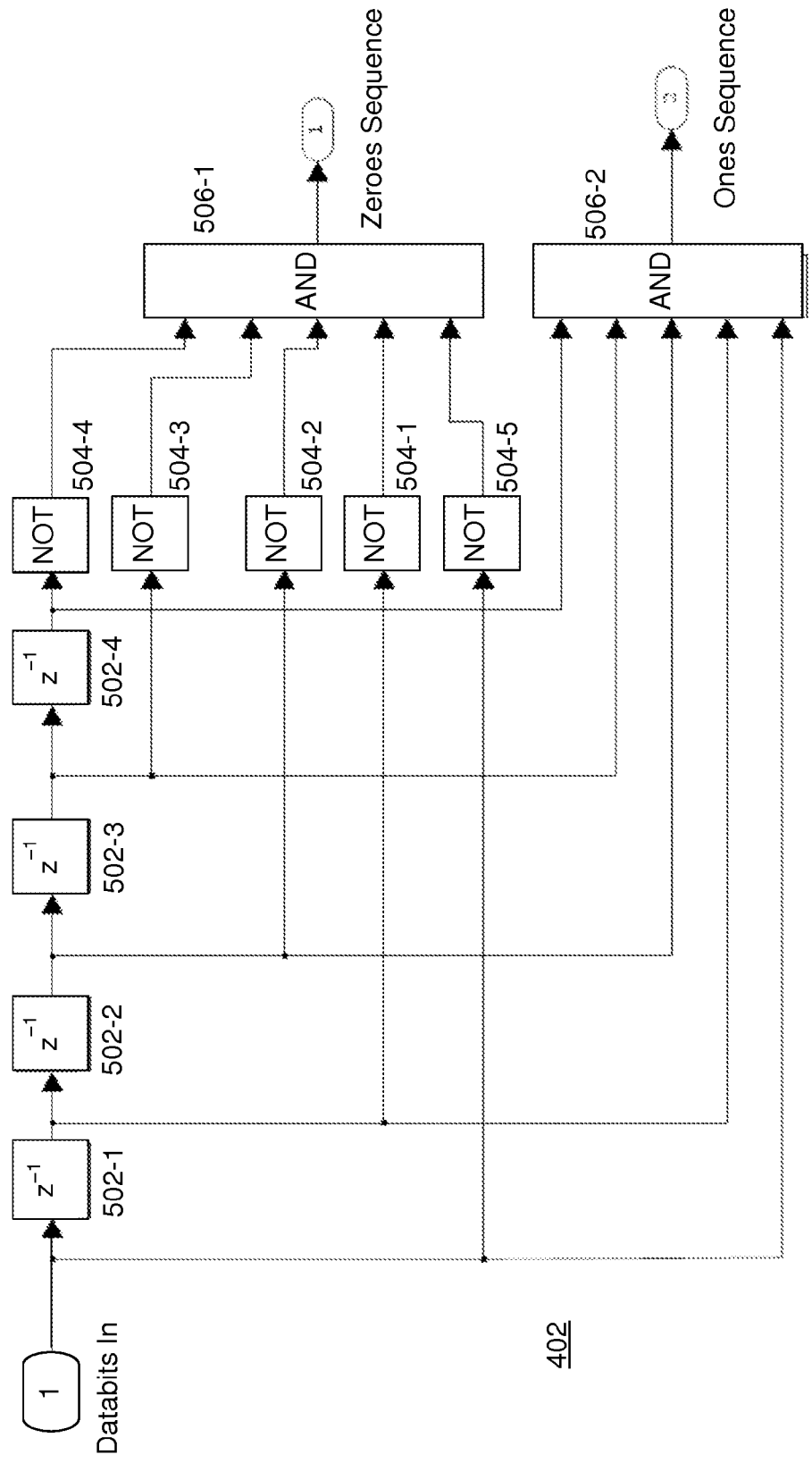
FIG. 5 is a block diagram of an example embodiment of a sequence detector for the arrangement of FIG. 4.

FIG. 5 is a block diagram of an example of a sequence detector 402 that is configured for detecting sequences of N≥5 consecutive occurrences of the same input data bits. The detector 402 comprises a four delay elements ($z^{-1}$ or $1/z$) 502-1, 502-2, 502-3, 502-4 in series with their respective outputs fed to respective ones of four logical NOT gates 504-1, 504-2, 504-3, 504-4. A fifth NOT gate 504-5 receives the undelayed input sequence. The outputs of the NOT gates are provided as inputs to a first AND gate 506-1, which produces the zeroes-sequence output signal described above. The respective outputs of the four delay elements and the undelayed input sequence are also provided as inputs to a second AND gate 506-2, which produces the ones-sequence output signal described above. In a logic arrangement such as that depicted in FIG. 5, the sequence length N can be changed easily by changing the number of delay elements 502 and corresponding number of NOT gates 504.

It will be understood that other implementations can be used. For example, the Gaussian filter 102 in the transmitter 400 can be a FIR filter that can include a delay-line, and so the sequence detector 402 can be implemented in a way that uses that delay-line and includes only a control logic of inverters and AND gates.

It will be also understood that other logical values and arrangements of output signals can be used. For example, an alternative to the arrangement of the sequence detector 402 shown in FIG. 5 can have a single tri-level output that has, for example, a value −1 when a sequence of N or more zeroes is detected, a value of +1 when a sequence of N or more ones is detected, and a value of zero when neither such sequence is detected.

As described above, the transfer function of the pre-emphasis filter 104 in FIG. 4 preferably depends on the characteristics of the PLL 110, which generally change with the carrier frequency. In production, the pre-emphasis filter transfer function can be adapted to compensate for the changing PLL characteristics, and at the same time for an IIR pre-emphasis filter, signal level offset compensation values can be tuned for the filter's transfer function.

FIG. 6A is a block diagram of an example of an offset compensator 404 that is suitable for a sequence detector 402 as depicted in FIG. 4. An input 1 of the compensator 404 is a control input that accepts the zeroes-sequence output signal of the detector 402. An input 2 of the compensator 404 is a control input that accepts the ones-sequence output signal of the detector 402. The zeroes-sequence output of the detector 402 is passed to a comparator 604-1, which determines whether the zeroes-sequence signal is HIGH, or more generally is the level that indicates occurrence of a sequence of at least N consecutive zeroes in the modulation data bits. In a similar way, the ones-sequence output of the detector 402 is passed to a comparator 604-2, which determines whether the ones-sequence signal is HIGH, or more generally is the level that indicates occurrence of a sequence of at least N consecutive ones in the modulation data bits.

Signal level offset compensation values are stored in the compensator 404 in three d.c.-level-offset compensation registers minus_comp, rand_comp, and plus_comp. The content of the minus_comp register is combined with the compensator's output signal by operation of an AND gate or multiplier 606-1 and the summer 602 when there is a long-enough sequence of zeroes, e.g., N≥5. The content of the rand_comp register is always combined with the compensator's output signal by the summer 602. The content of the plus_comp register is combined with the compensator's output signal by operation of an AND gate or multiplier 606-2 and the summer 602 when there is a long enough data sequence of ones, e.g., N≥5. The AND gates 606-1, 606-2 are arranged to pass the respective offset compensation values through the gate, when the other gate input is logic one.

As noted above, the content of each register, which is to say, the amount of offset compensation for particular input data, can be defined during design of the modulator or adjusted or calibrated during production. In the simulations illustrated above, for example, the register values were plus_comp=388, minus_comp=−388, and rand_comp=230.

The value in the rand_comp register can compensate static offset generated in the system, which is seen as frequency offset of the RF signal. Thus, the rand_comp value can be adjusted or tuned to a suitable value by observing the behavior of the frequency error of a randomly modulated transmit signal.

Computer simulations indicated that plus_comp=−minus_comp, which is to say that the values in those two registers are the same except for their signs. In an actual implementation, it can be advantageous for the plus_comp and minus_comp values to have their own registers as shown in FIG. 6 for extra flexibility. The plus_comp and minus_comp values can be adjusted or tuned by observing the peak frequency deviation of the RF modulated signal for a long sequence of the same symbol and ensuring that the deviation has the right value.

It will be noted that the modulation transfer function of the frequency synthesizer 110 typically depends on the frequency band used and the component tolerances in the phase detector 114, loop filter 116, and VCO 118. The transfer function of the pre-emphasis filter 104 can be calculated based on the modulation transfer function of an actual PLL 110. Thus, if the pre-emphasis filter changes, then new compensation values can be needed for the plus_comp, minus_comp, and rand_comp registers. In production, a set of default values can be used initially for the pre-emphasis filter 104 and offset compensator 404 for each frequency band. The default values can then be adjusted or tuned if necessary to obtain optimum performance.

The signal processing of the Gaussian filter 102 and the pre-emphasis filter 104 delays the output of the filter 104 with respect to the compensation control bits provided to the offset compensator 404. That delay is compensated by delay blocks 608-1, 608-2 in the compensator 404. As depicted in FIG. 6A, the delay blocks 608 can delay the outputs of the AND gates 606 by thirty samples or the equivalent time at the sampling rate of the pre-emphasis filter 104, which is typically higher than the modulation data bit rate. It will be appreciated that correct timing between the output of the filter 104 and the output of the compensator 404 is important for accurate offset compensation. An incorrect offset error compensation timing degrades the accuracy of modulation of data bits that are not in either a sequence of zeroes or a sequence of ones.

A major part of the delay comes from the Gaussian pulse-shaping filter 102, and so that part has a value easy to calculate from the filter implementation. A minor part of the delay comes from the pre-emphasis filter 104. The actual value of the pre-emphasis filter's contribution can be adjusted or tuned by minimizing the root-mean-square (RMS) phase error of a test signal containing long enough sequences of ones and zeros within a transmitted time slot. For production, such delay values found during product development can be used as default values.

It will be understood that other logical values and arrangements of input and output signals can be used. For example, FIG. 6B shows an alternative to the arrangement of the compensator 404 shown in FIG. 6A.

FIG. 6B is a block diagram of an offset compensator 404-1 that can accept a single tri-level output signal from the sequence detector 402. Compared to FIG. 6A, the compensator 404-1 connects inputs 1 and 2 and has a comparator 604-11 that determines whether the zeroes-sequence signal is the level that indicates occurrence of a sequence of at least N consecutive zeroes in the modulation data bits. The other components of the compensator 404-1 can be the same as the corresponding components of the compensator 404, and the operations of the compensators are otherwise substantially the same.

Figure 7:
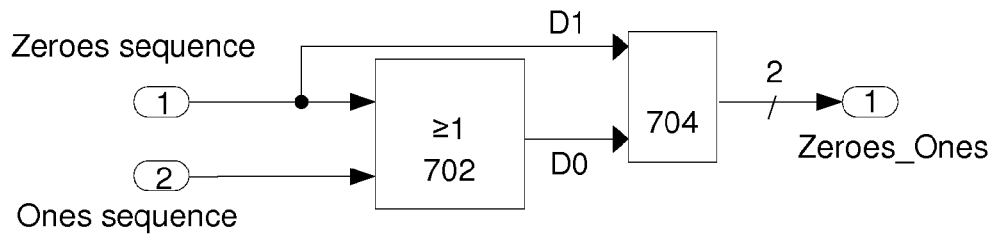
FIG. 7 is a block diagram of a signal translator for converting dual sequence detector output signals into a single tri-level, or two-bit, signal.

The dual output signals generated by the sequence detector 402 depicted in FIG. 5 that can be provided to the compensator 404 depicted in FIG. 6A can be converted into a tri-level signal suitable for the compensator 404-1 depicted in FIG. 6B in many equivalent ways. For example, FIG. 7 depicts a signal translator 700 for converting dual sequence detector output signals into a single tri-level, or two-bit, signal. The translator 700 includes a comparator 702 that compares each of a zeroes sequence input value and a ones sequence input value to logic one or its equivalent. The output signal D0 generated by the comparator 702 is provided with the zeroes sequence signal D1 to a circuit block 704 that is configured to pass through the output signal DO when the zeroes sequence is low and to invert the sign of the signal DO when the zeroes sequence is high. It will be appreciated, of course, that the translator 700 can be configured to operate in other ways, e.g., two's complement presentation with three bits, etc.

It will be appreciated that in an arrangement such as that depicted in FIG. 4, it is not necessary to change the transfer function, or frequency response, of the pre-emphasis filter 104 to deal with any offset of the d.c. level of the filter's output signal. It is enough just to correct the offset by adding (or subtracting) an appropriate amount to the filter's output signal. Moreover, the need for compensation is not determined based on just a part of the input data, but is advantageously determined continuously during substantially all of the input data. As a result, some parts of the input data may result in compensation being applied and other parts of the input data may result in compensation not being applied. Incoming data is checked with a sequence detector and compensated without needing real-time feedback and associated delay of the modulation signal.

The compensation can correct offsets caused by round-off errors, filter topology, and other effects in the digital domain rather than on an integrated-circuit level, and so the compensation can be readily implemented by a suitably configured or programmed digital signal processor and/or suitably configured digital logic circuitry, avoiding problems arising from circuit component rise-times, etc.

Figure 8:
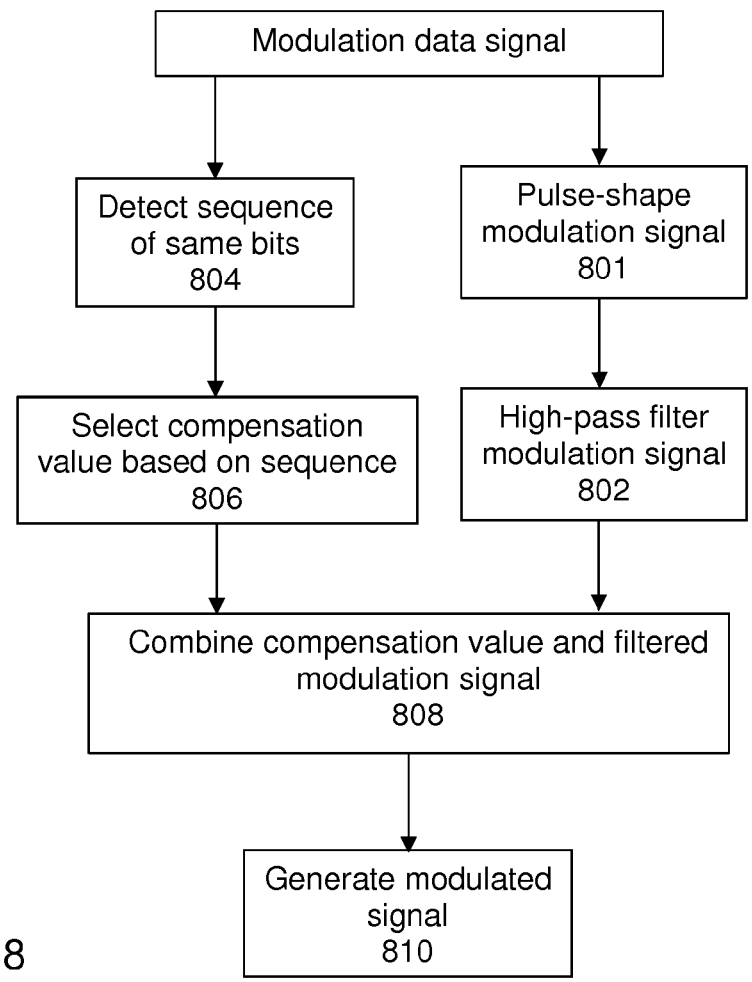
FIG. 8 is a flow chart of a method of compensating a frequency response of a modulator.

FIG. 8 is a flow chart of a method of compensating a frequency response of an electronic signal modulator as described above. The method includes pulse-shaping (step 801) a digital modulation data signal, e.g., by operation of a Gaussian filter 102 and high-pass filtering (step 802) the pulse-shaped digital modulation data signal, thereby generating a filtered modulation signal, e.g., by operation of a pre-emphasis filter 104. A sequence of bits or symbols of the digital modulation data signal that are the same is detected (step 804), where the sequence has a length of at least a number N of bits or symbols, e.g., by operation of sequence detector 402. As described above, N may be 3, or 5, or another value. A compensation value is selected (step 806) based on a sequence detected, e.g., by operation of an offset compensator 404, 404-1, and the compensation value and the filtered modulation signal are combined (step 808), e.g., by operation of a summer 406, thereby generating a compensated modulation signal. A carrier signal modulated by the compensated modulation data signal is generated (step 810), e.g., by operation of a PLL 110, based on the compensated modulation data signal, and the modulated carrier signal can be amplified and transmitted, e.g., by operation of an amplifier 420 and an antenna 440.

Embodiments of this invention can have several advantages over prior techniques. For example, a small-size IIR filter for pre-emphasis can be used in transmitter synthesizer modulation. Improved performance can be obtained. In measurements in the 1900-MHz band, the GMSK RMS phase error was approximately 12 degrees without compensation for long sequences or ONE or ZERO data, but with offset compensation, the RMS phase error was only 3.5 degrees. The size of the compensation logic can be small. GMSK modulation can be applied to a transmitter synthesizer with only small additional cost.

The methods and devices described above can be combined and re-arranged in a variety of equivalent ways, and the methods can be performed by one or more suitable electronic circuits (e.g., discrete logic gates interconnected to perform a specialized function, or application-specific integrated circuits). Devices embodying this invention can include, for example, wireless telephones, sensors, computers, and other devices that include signal modulators with pre-emphasis.

Thus, the invention may be embodied in many different forms, not all of which are described above, and all such forms are contemplated to be within the scope of the claims.

What is claimed is:
1. An electronic signal modulator (400), comprising:
a pulse-shaping filter (102) that receives a digital modulation data signal;
a high-pass pre-emphasis filter (104);
a phase-locked loop (PLL) (110) that generates a carrier signal modulated by the digital modulation data signal, wherein the PLL has a low-pass frequency response to be compensated by a frequency response of the pre-emphasis filter;

a sequence detector (402) configured to detect a sequence of bits of the digital modulation data signal that are the same, wherein the sequence has a length of at least a number N of bits, and the sequence detector generates an output signal based on a sequence detected;

an offset compensator (404) responsive to the output signal of the sequence detector and configured to add a compensation value to an output of the pre-emphasis filter; and a summer (406, 106) configured for receiving the output of the pre-emphasis filter and the compensation value and for generating a control signal applied to the PLL.

2. The modulator of claim 1, wherein the sequence detector generates an output signal that has a value −1 when the sequence detected is a sequence of zeroes; a value +1 when the sequence detected is a sequence of ones; and a value 0 when the sequence is not detected.

3. The modulator of claim 1, wherein the offset compensator is configured to store a plurality of compensation values in respective registers.

4. The modulator of claim 3, wherein one of the stored compensation values corresponds to a sequence of zeroes and another of the stored compensation values corresponds to a sequence of ones.

5. The modulator of claim 1, wherein the control signal is applied to a fractional-N synthesizer frequency divider (120) in the PLL.

6. The modulator of claim 1, wherein the electronic signal modulator is included in a transmitter (450) for a communication device.

7. The modulator of claim 6, wherein the transmitter includes a power amplifier (420) configured to receive the carrier signal modulated by the digital modulation data signal, and an antenna (440) configured to transmit a signal generated by the power amplifier.

8. A method of compensating a frequency response of an electronic signal modulator, comprising:

high-pass filtering (802) a digital modulation data signal, thereby generating a filtered modulation signal;

detecting (804) a sequence of bits of the digital modulation data signal that are the same, wherein the sequence has a length of at least a number N of bits;

selecting (806) a compensation value based on a sequence detected;

combining (808) the compensation value and the filtered modulation signal, thereby generating a compensated modulation signal; and generating (810) a carrier signal modulated by the compensated modulation signal.

9. The method of claim 8, wherein detecting the sequence of bits includes generating a signal that has a value −1 when the sequence detected is a sequence of zeroes; a value +1 when the sequence detected is a sequence of ones; and a value 0 when the sequence is not detected.

10. The modulator of claim 8, wherein the compensation value is selected from a plurality of compensation values stored in respective registers.

11. The method of claim 10, wherein one of the stored compensation values corresponds to a sequence of zeroes and another of the stored compensation values corresponds to a sequence of ones.

12. The method of claim 8, further comprising amplifying the carrier signal.

\* \* \* \* \*